United States Patent
Kim et al.

(10) Patent No.: US 10,460,923 B2
(45) Date of Patent: Oct. 29, 2019

(54) APPARATUS AND METHOD FOR TREATING SUBSTRATE

(71) Applicant: SEMES CO., LTD., Chungcheongnam-do (KR)

(72) Inventors: Young Ha Kim, Daejeon (KR); Se Jeong Choi, Gyeongsangbuk-do (KR); Kang Suk Lee, Chungcheongnam-do (KR); Kiyoung Kwark, Gyeonggi-do (KR); Jeoung Eun Park, Gyeonggi-do (KR); Jeong Yeong Park, Chungcheongnam-do (KR)

(73) Assignee: SEMES CO., LTD., Chungcheongnam-Do (KR)

(*) Notice: Subject to any disclaimer, the term of this patent is extended or adjusted under 35 U.S.C. 154(b) by 24 days.

(21) Appl. No.: 15/635,535

(22) Filed: Jun. 28, 2017

(65) Prior Publication Data
US 2018/0005817 A1   Jan. 4, 2018

(30) Foreign Application Priority Data

Jun. 30, 2016   (KR) .................. 10-2016-0082521

(51) Int. Cl.
| H01L 21/02 | (2006.01) |
| B08B 3/02 | (2006.01) |
| B08B 3/08 | (2006.01) |
| B08B 3/10 | (2006.01) |
| H01L 21/67 | (2006.01) |
| H01L 21/687 | (2006.01) |

(52) U.S. Cl.
CPC ........ *H01L 21/02052* (2013.01); *B08B 3/024* (2013.01); *B08B 3/08* (2013.01); *B08B 3/10* (2013.01); *H01L 21/67051* (2013.01); *H01L 21/68764* (2013.01)

(58) Field of Classification Search
CPC combination set(s) only.
See application file for complete search history.

(56) References Cited

U.S. PATENT DOCUMENTS

| 2004/0187896 A1* | 9/2004 | Konishi ................. B08B 3/024 134/33 |
| 2008/0041420 A1* | 2/2008 | Sekiguchi ............... B08B 3/02 134/18 |
| 2014/0261570 A1* | 9/2014 | Orii .................. H01L 21/02052 134/31 |

FOREIGN PATENT DOCUMENTS

| JP | 2003320323 A | 11/2003 |
| KR | 10-1998-0084217 | 12/1998 |
| KR | 20060061816 A | 6/2006 |

(Continued)

*Primary Examiner* — Erin F Bergner
(74) *Attorney, Agent, or Firm* — Carter, DeLuca & Farrell LLP

(57) ABSTRACT

Disclosed are an apparatus and a method for liquid-treating a substrate. The method for liquid-treating a substrate includes a first treatment liquid supplying operation of supplying a first treatment liquid to a treatment location of the substrate, and a wetting operation of, after the first treatment liquid supplying operation, supplying a wetting liquid onto the substrate, wherein the wetting operation includes a simultaneous supply operation of supplying the wetting liquid to the first location while the first treatment liquid is supplied, and wherein the first location is a location deviating from the treatment location. Accordingly, the surface of the substrate may be prevented from being dried while the treatment liquid is converted to a wetting liquid.

10 Claims, 7 Drawing Sheets

(56) References Cited

FOREIGN PATENT DOCUMENTS

KR  20070102611 A  10/2007
KR  20020079828 A  1/2008
KR  10-0887364     3/2009

\* cited by examiner

APPARATUS AND METHOD FOR TREATING SUBSTRATE

CROSS-REFERENCE TO RELATED APPLICATIONS

A claim for priority under 35 U.S.C. § 119 is made to Korean Patent Application No. 10-2016-0082521 filed Jun. 30, 2016, in the Korean Intellectual Property Office, the entire contents of which are hereby incorporated by reference.

BACKGROUND

Embodiments of the inventive concept described herein relate to ~, and more particularly, relate to an apparatus and a method for liquid-treating a substrate.

In order to manufacture a semiconductor device or a liquid crystal display, various processes such as photographing, ashing, etching, ion implantation, thin film deposition, and cleaning are performed on a substrate. Among them, the cleaning process is a process of removing particles residing on the substrate, and is performed before and after the processes.

The cleaning process is differently applied according to a surface property of the substrate. In particular, when a surface of the substrate is hydrophobizied or the hydrophobized surface is cleaned, a chemical treating operation and a wetting operation are performed. A chemical is supplied to the substrate during rotation of the substrate, and then the wetting liquid is supplied.

However, several seconds are taken in a process of converting the chemical treating operation to the wetting operation. The supply of the liquid to the substrate is topped in a process of converting the operations. Accordingly, a peripheral area of the substrate fails to maintain a wet state but is dried. This causes particles to be attached to the peripheral area of the substrate or causes a cleaning defect, such as a watermark.

SUMMARY

Embodiments of the inventive concept provide an apparatus and a method for improving a cleaning efficiency for a surface of a substrate having a hydrophobic property.

The inventive concept provides an apparatus and a method for liquid-treating a substrate. In accordance with an aspect of the inventive concept, there is provided an apparatus for liquid-treating a substrate, the apparatus including a treatment container having a treatment space in the interior thereof, a substrate support unit supporting the substrate in the treatment space, a fixed nozzle unit fixedly installed in the treatment container, and a movable nozzle unit being movable to a location facing the treatment space and including a first movable nozzle configured to supply a first treatment liquid onto the substrate supported by the substrate support unit, wherein the fixed nozzle unit includes a first fixed nozzle configured to supply a wetting liquid to a first location of the substrate supported by the substrate support unit, and a second fixed nozzle configured to supply the wetting liquid to a second location of the substrate supported by the substrate support unit, and wherein the first location is a location that is farther from the center of the substrate than the second location.

The first movable nozzle may supply the first treatment liquid to a treatment location of the substrate supported by the substrate support unit, and the first location may be a location that is different from the treatment location. The treatment location and the second location may correspond to a central area of the substrate supported by the substrate support area, and the first location may correspond to a peripheral area of the substrate supported by the substrate support unit. The first treatment liquid may be a liquid for hydrophobizing a surface of the substrate, and the wetting liquid may be pure water. The apparatus may further include a controller configured to control the fixed nozzle unit and the movable nozzle unit, and the controller controls the fixed nozzle unit and the movable nozzle unit such that a first treatment liquid supplying operation of supplying the first treatment liquid onto the substrate and a simultaneous supply operation of supplying a wetting liquid to the first location while the first treatment liquid is supplied are sequentially performed.

The controller may control the fixed nozzle unit and the movable nozzle unit such that, after the simultaneous supply operation, a first wetting operation of stopping the supply of the first treatment liquid and continuously supplying the wetting liquid to the first location is performed. The controller may control the fixed nozzle unit and the movable nozzle unit such that, after the first wetting operation, a second wetting operation of supplying the wetting liquid to the first location and the second location is performed. The movable nozzle unit may further include a second movable nozzle being movable to a location facing the treatment space and configured to supply a second treatment liquid onto the substrate supported by the substrate support unit, and wherein the controller controls the movable nozzle unit such that, after the second wetting operation, the second treatment liquid supplying operation of supplying the second treatment liquid onto the substrate is performed.

The second treatment liquid may be a liquid for hydrophilizing a surface of the substrate.

In accordance with another aspect of the inventive concept, there is provided a method for liquid-treating a substrate, including a first treatment liquid supplying operation of supplying a first treatment liquid to a treatment location of the substrate, and a wetting operation of, after the first treatment liquid supplying operation, supplying a wetting liquid onto the substrate, wherein the wetting operation includes a simultaneous supply operation of supplying the wetting liquid to the first location while the first treatment liquid is supplied, and wherein the first location is a location deviating from the treatment location.

The treatment location may correspond to a central area of the substrate, and the first location may correspond to a peripheral area of the substrate. The wetting operation may include a first wetting operation of, after the simultaneous supply operation, supplying the wetting liquid to the first location of the substrate, and the supply of the first treatment liquid may be stopped in the first wetting operation. The wetting operation may further include a second wetting operation of, after the first wetting operation, supplying the wetting liquid to the first location and the second location, and the second location may correspond to a central area of the substrate. The method may further include a second treatment liquid supplying operation of, after the second wetting operation, supplying a second treatment liquid, which is different from the first treatment liquid, onto the substrate.

The first treatment liquid may be a liquid for hydrophobizing a surface of the substrate, and the wetting liquid may be pure water. The first treatment liquid may be a chemical including a hydrofluoric acid.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
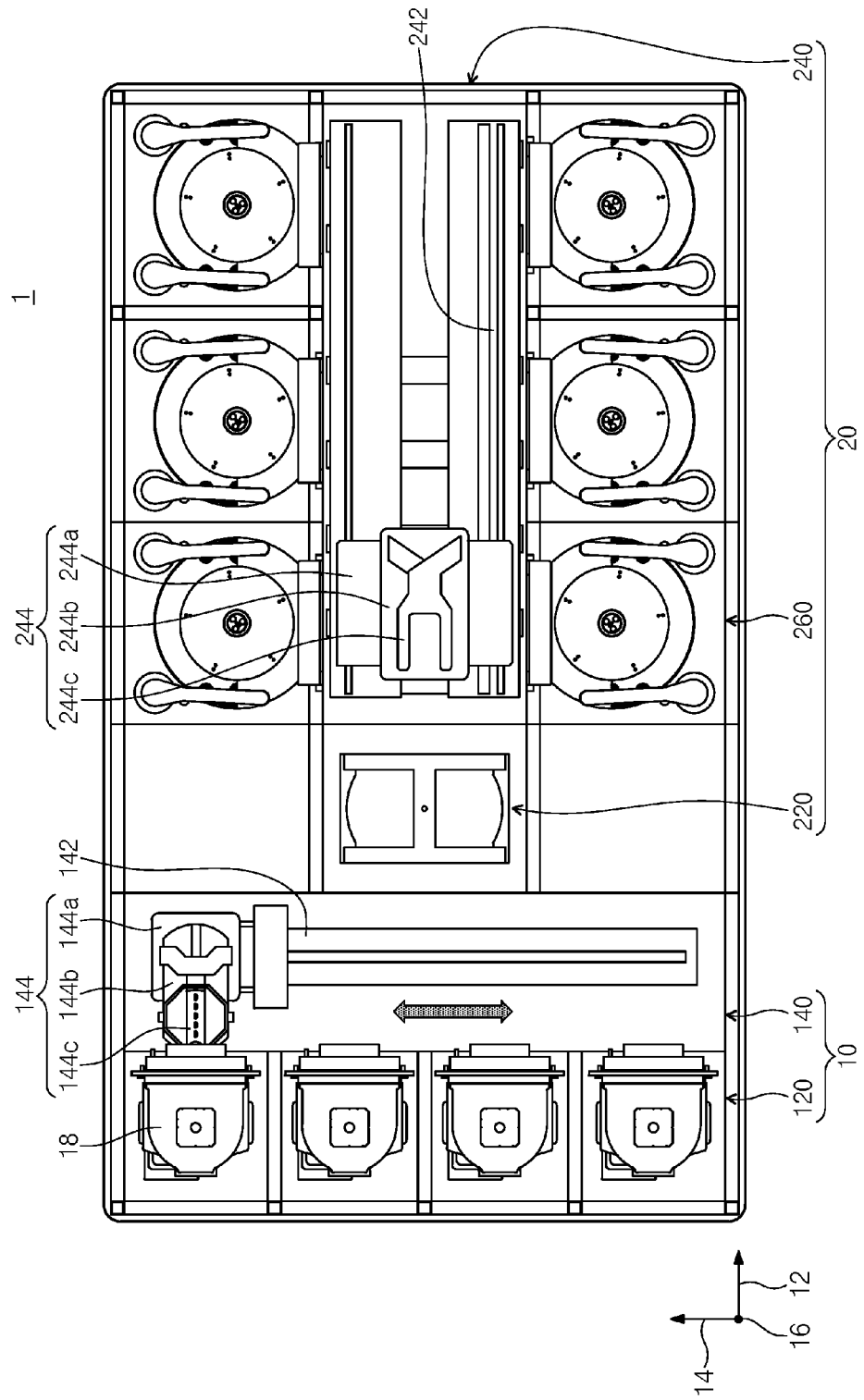
FIG. 1 is a plan view illustrating a substrate treating system according to a first embodiment of the inventive concept.

The embodiments of the inventive concept may be modified in various forms, and the scope of the inventive concept should not be construed to be limited by the embodiments of the inventive concept described in the following. The embodiments of the inventive concept are provided to describe the inventive concept for those skilled in the art more completely. Accordingly, the shapes and the like of the components in the drawings are exaggerated to emphasize clearer descriptions.

In the embodiment, a process of hydrophobizing a surface of a substrate and cleaning the substrate will be described as an example. Hereinafter, exemplary embodiments of the inventive concept will be described with reference to FIGS. 1 to 10.

FIG. 1 is a plan view illustrating a substrate treating system according to an embodiment of the inventive concept. Referring to FIG. 1, the substrate treating system 1 includes an index module 10 and a process treating module 20. The index module 10 includes a plurality of load ports 120 and a feeding frame 140. The load ports 120, the feeding frame 140, and the process treating module 20 may be sequentially arranged in a row. Hereinafter, a direction in which the load ports 120, the feeding frame 140, and the process treating module 20 are arranged will be referred to as a first direction 12, a direction that is perpendicular to the first direction 12 when viewed from the top will be referred to as a second direction 14, and a direction that is normal to a plane containing the first direction 12 and the second direction 14 will be referred to as a third direction 16.

A carrier 18, in which a substrate W is received, is seated on the load port 120. A plurality of load ports 120 are provided, and are arranged along the second direction 14 in a row. However, the number of the load ports 120 may increase or decrease according to a condition, such as the process efficiency of the process treating module 20 or a footprint. A plurality of slots (not illustrated) for receiving substrates W while the substrates W are arranged in parallel to the ground surface are formed in the carrier 18. A front opening unified pod (FOUP) may be used as the carrier 18.

The process treating module 20 includes a buffer unit 220, a feeding chamber 240, and a plurality of process chambers 260. The feeding chamber 240 is arranged such that the lengthwise direction thereof is in parallel to the first direction 12. Process chambers 260 are arranged on opposite sides of the feeding chamber 240. The process chambers 260 are provided on the opposite sides of the feeding chamber 240 to be symmetrical to each other with respect to the feeding chamber 240. Some of the process chambers 260 are arranged along the lengthwise direction of the feeding chamber 240. Furthermore, some of the process chambers 260 are arranged to be stacked on each other. That is, the process chamber 260 having an array of A by B may be arranged on one side of the feeding chamber 240. Here, A is the number of the process chambers 260 provided in a row along the first direction 12, and B is the number of the process chambers 260 provided in a row along the third direction 16. When four or six process chambers 260 are provided on one side of the feeding chamber 240, the process chambers 260 may be arranged in an array of 2 by 2 or 3 by 2. The number of the process chambers 260 may increase or decrease.

Selectively, the process chambers 260 may be provided only on one side of the feeding chamber 240. Further, the process chambers 260 may be provided on one side or opposite sides of the feeding chamber 240 to form a single layer.

The buffer unit 220 is disposed between the feeding frame 140 and the feeding chamber 240. The buffer unit 220 provides a space in which the substrates W stay before being transported, between the feeding chamber 240 and the feeding frame 140. A plurality of slots (not illustrated) in which the substrates W are positioned are provided in the interior of the buffer unit 220. A plurality of slots (not illustrated) may be provided to be spaced apart from each other along the third direction 16. A face of the buffer unit 220 that faces the feeding frame 140 and a face of the buffer unit 220 that faces the feeding chamber 240 are opened.

The feeding frame 140 transports the substrates W between the carrier 18 seated on the load port 120 and the buffer unit 220. An index rail 142 and an index robot 144 are provided in the feeding frame 140. The index rail 142 is arranged such that the lengthwise direction thereof is in parallel to the second direction 14. The index robot 144 is installed on the index rail 142, and is linearly moved in the second direction 14 along the index rail 142. The index robot 144 has a base 144a, a body 144b, and a plurality of index arms 144c. The base 144a is installed to be moved along the index rail 142. The body 144b is coupled to the base 144a. The body 144b is provided to be moved along the third direction 16 on the base 144a. The body 144b is provided to be rotated on the base 144a. The index arms 144c are coupled to the body 144b, and are provided to be moved forwards and rearwards with respect to the body 144b. A plurality of index arms 144c are provided to be driven individually. The index arms 144c are arranged to be stacked so as to be spaced apart from each other along the third direction 16. Some of the index arms 144c are used when the substrates W are transported to the carrier 18 in the process module 20, and some of the index arms 144c may be used when the substrates W are transported from the carrier 18 to the process treating module 20. This structure may prevent particles generated from the substrates W before the process treatment from being attached to the substrates W after the process treatment in the process of carrying the substrates W in and out by the index robot 144.

The feeding chamber 240 transports the substrates W between the buffer unit 220 and the process chambers 260, and between the process chambers 260. An guide rail 242 and a main robot 244 are provided in the feeding chamber 240. The guide rail 242 is arranged such that the lengthwise direction thereof is in parallel to the first direction 12. The main robot 244 is installed on the guide rail 242, and is linearly moved along the first direction 12 on the guide rail 242. The main robot 244 has a base 244a, a body 244b, and a plurality of main arms 244c. The base 244a is installed to be moved along the guide rail 242. The body 244b is coupled to the base 244a. The body 244b is provided to be moved along the third direction 16 on the base 244a. The body 244b is provided to be rotated on the base 244a. The main arms 244c are coupled to the body 244b, and are provided to be moved forwards and rearwards with respect to the body 244b. A plurality of main arms 244c are provided to be driven individually. The main arms 244c are arranged to be stacked so as to be spaced apart from each other along the third direction 16.

Substrate treating apparatuses 300 that perform cleaning processes on the substrates W are provided in the process chambers 260. The substrate treating apparatus 300 may have different structures according to the types of the cleaning processes. Alternatively, the substrate treating apparatuses 300 in the process chambers 260 may have the same structure. Selectively, the process chambers 260 may be classified into a plurality of groups such that the structures of the substrate treating apparatuses 300 in the process chambers 260 pertaining to the same group are the same and the structures of the substrate treating apparatuses 300 in the process chambers 260 pertaining to different groups are different.

Figure 2:
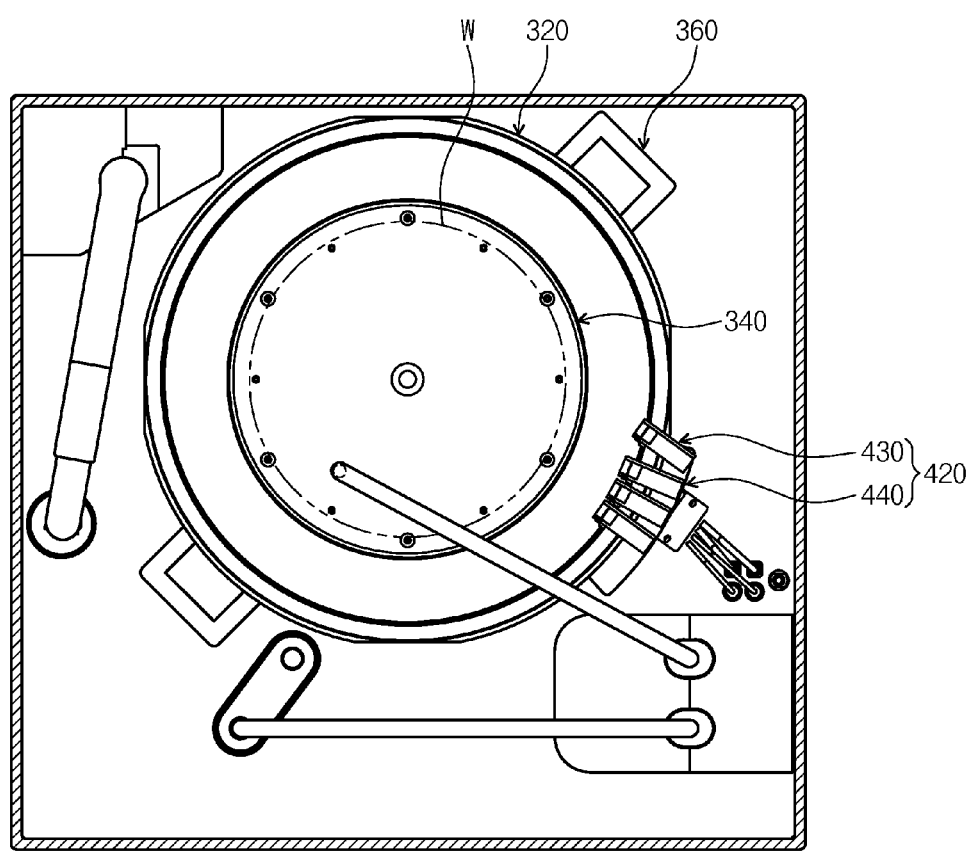
FIG. 2 is a plan view illustrating the substrate treating apparatus of FIG. 1.
Figure 3:
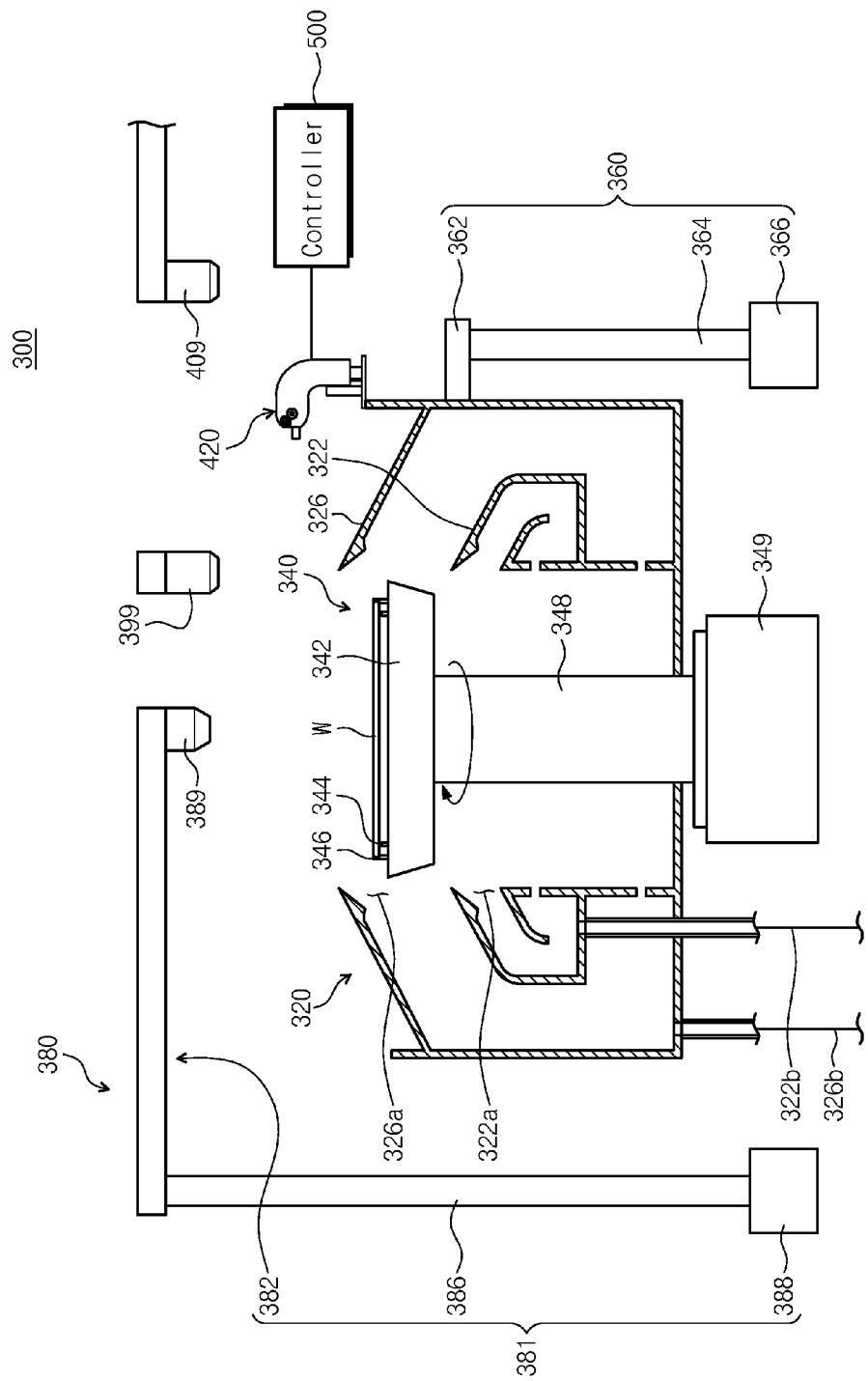
FIG. 3 is a sectional view illustrating the substrate treating apparatus of FIG. 2.

The substrate treating apparatus 300 performs a process of hydrophobizing a surface of a substrate and cleaning the substrate. FIG. 2 is a sectional view illustrating a substrate treating apparatus of FIG. 1. Referring to FIG. 2, the substrate treating apparatus 300 includes a treatment container 320, a spin head 340, an elevation unit 360, and a liquid supply unit 380.

The treatment container 320 has an open-topped vessel shape. The treatment container 320 includes an inner recovery vessel 322 and an outer recovery vessel 326. The recovery vessels 322 and 324 recover different treatment liquids used in the process. The inner recovery vessel 322 is provided to have an annular ring shape that surrounds the spin head 340, and the outer recovery vessel 326 is provided to have an annular ring shape that surrounds the inner recovery vessel 326. An inner space 322a of the inner recovery vessel 322 functions as a first inlet 322a, through which the treatment liquid is introduced into the inner recovery vessel 322. A space 326a between the inner recovery vessel 322 and the outer recovery vessel 326 functions as a second inlet 326a, through which the treatment liquid is introduced into the outer recovery vessel 326. According to an embodiment, the inlets 322a and 326a may be situated at different heights. Recovery lines 322b and 326b are connected to the bottom surfaces of the recovery vessels 322 and 326 below the recovery vessels 322 and 326. The treatment liquids introduced into the recovery vessels 322 and 326 may be provided to an external treatment liquid recycling system (not illustrated) through the recovery lines 322b and 326b to be reused.

The spin head 340 is provided as a substrate support unit 340 that supports and rotates the substrate W during the process. The spin head 340 has a body 342, a plurality of support pins 344, a plurality of chuck pins 346, and a support shaft 348. The body 342 has an upper surface having a substantially circular shape when viewed from the top. The support shaft 348 that may be rotated by a driver 349 is fixedly coupled to the bottom of the body 342.

A plurality of support pins 344 are provided. The support pins 344 may be arranged to be spaced apart from each other at a periphery of the upper surface of the body 342 and protrude upwards from the body 342. The support pins 344 are arranged to have a generally annular ring shape through combination thereof. The support pins 344 support a periphery of a rear surface of the substrate W such that the substrate W is spaced apart from the upper surface of the body 342 by a predetermined distance.

A plurality of chuck pins 346 are provided. The chuck pins 346 are arranged to be more distant from the center of the body 342 than the support pins 344. The chuck pins 346 are provided to protrude upwards from the body 342. The chuck pins 346 support a side of the substrate W such that the substrate W is not separated laterally from a proper place when the spin head 340 is rotated. The chuck pins 346 are provided to be linearly moved between a standby position and a support position along a radial direction of the body 342. The standby position is a position that is more distant from the center of the body 342 than the support position. When the substrate W is loaded on or unloaded from the spin head 340, the chuck pins 346 are located at the standby position, and when a process is performed on the substrate W, the chuck pins 346 are located at the support position. The chuck pins 346 are in contact with the side of the substrate W at the support position.

The elevation unit 360 linearly moves the treatment container 320 upwards and downwards. When the treatment container 320 is moved upwards and downwards, a relative height of the treatment container 320 to the spin head 340 is changed. The elevation unit 360 has a bracket 362, a movable shaft 364, and a driver 366. The bracket 362 is fixedly installed on an outer wall of the treatment container 320, and the movable shaft 364 that is moved upwards and downwards by the driver 366 is fixedly coupled to the bracket 362. The treatment container 320 is lowered such that, when the substrate W is positioned on the spin head 340 or is lifted from the spin head 340, the spin head 340 protrudes to the upper side of the treatment container 320. When the process is performed, the height of the treatment container 320 is adjusted such that the treatment liquid is introduced into the preset recovery vessel 360 according to the kind of the treatment liquid supplied to the substrate W. Selectively, the elevation unit 360 may move the spin head 340 upwards and downwards.

The liquid supply unit supplies various kinds of liquids onto the substrate W. According to an embodiment, the liquid supply unit may supply a chemical, a rinsing liquid, and an organic solvent. The liquid supply unit includes a movable nozzle unit 380, a fixed nozzle unit 420, and a controller 500.

The movable nozzle unit 380 includes a first movable nozzle 389, a second movable nozzle 399, a substitution nozzle 409, and a plurality of nozzle moving member 381. The first movable nozzle 389 discharges a first treatment liquid, the second movable nozzle 399 discharges a second treatment liquid, and the substitution nozzle 409 discharges an organic solvent. The first movable nozzle 389, the second movable nozzle 399, and the substitution nozzle 409 supplies a liquid to a treatment location of the substrate W supported by the substrate support unit 340. Here, the treatment location may be a location including the center of the substrate W. The first movable nozzle 389, the second movable nozzle 399, and the substitution nozzle 409 may be moved to process locations and standby locations by the nozzle moving member 381, respectively. Here, the process locations are locations at which the nozzles face the substrate W supported by the substrate support unit 340, respectively, and the standby locations are locations at which the nozzles 389, 399, and 409 deviate from the process locations, respectively. According to an embodiment, the process locations may be locations at which the nozzles 389, 399, and 409 may supply the liquid to the center of the substrate W, respectively. The first treatment liquid and the second treatment liquid may be chemicals of different properties. The first treatment liquid is a chemical including diluted hydrofluoric acid (HF), and the second treatment liquid may be a chemical including ammonia ($NH_3$). The organic solvent may be a liquid including isopropyl alcohol (IPA).

The nozzle moving member 381 includes a support shaft 386, a support arm 382, and a driver member 388. The support shaft 386 is located on one side of the treatment container 320. The support shaft 386 has a rod shape, a lengthwise direction of which faces the third direction 16. The support shaft 386 may be rotated by the driver member 388. The support arm 382 is coupled to an upper end of the support shaft 386. The support arm 382 extends from the support shaft 386 to be perpendicular to the support shaft 386. The nozzles are fixedly coupled to an end of the support arm 382. As the support shaft 386 is rotated, the nozzles 389, 399, and 409 may be swung together with the support arm 382. The nozzles 389, 399, and 409 may be swung and be moved to the process locations and the standby locations. When viewed from the top, the nozzles 389, 399, and 409 may be located such that the discharge holes of the nozzles 389, 399, and 409 coincide with the center of the substrate W.

Selectively, the support shaft 386 may be elevated. Further, the support arm 382 may be moved forwards and rearwards along a lengthwise direction thereof.

The fixed nozzle unit 420 supplies a wetting liquid to the substrate W. The fixed nozzle unit 420 includes a first fixed nozzle member 430 and a second fixed nozzle member 440. The first fixed nozzle member 430 and the second fixed nozzle member 440 supply a wetting liquid to the substrate W supported by the substrate support unit 340. The first fixed nozzle member 430 supplies the wetting liquid to the first location of the substrate W, and the second fixed nozzle member 440 supplies the wetting liquid to the second location. Here, the first location of the substrate W is a location deviating from the treatment location, and the second location is a location including the center of the substrate W. For example, the first location may be a location that is closer to a side end of the substrate W than to the center of the substrate W. The second location may be the center of the substrate W or a location that is closer than the side end of the substrate W. A fixed nozzle 432 and a bracket 434 are provided. A relative location between the fixed nozzle 432 and the treatment container 320 is fixed. The fixed nozzle 432 is located outside the treatment container 320. The fixed nozzle 432 is fixedly coupled to the treatment container 320 by the bracket 434. The bracket 434 is fixedly coupled to an outside of the treatment container 320, and supports the fixed nozzle 432. The fixed nozzle 432 may be located at a height corresponding to an upper surface of the treatment container 320 or higher than the upper surface of the treatment container 320. The wetting liquid may be discharged from the fixed nozzle 432 in a hyperbolic path or in a downwardly inclined direction. For example, the wetting liquid may be a wetting liquid that maintains the surface of the substrate W in a wet state. The wetting liquid may be pure water.

The controller 500 controls the movable nozzle unit 380 and the fixed nozzle unit 420. The controller 500 controls the nozzle units 380 and 420 such that a first treatment liquid supplying operation S20, a primary wetting operation S30 to S50, a second treatment liquid supplying operation S60, a secondary wetting operation S70 to S90, and a substitution operation S100 are sequentially performed. A first treatment liquid is supplied onto the substrate W in the first treatment liquid supplying operation S20, a second treatment liquid is supplied onto the substrate W in the second treatment liquid supplying operation S60, and an organic solvent is supplied onto the substrate W in the replacing operation S100.

Each of the primary wetting operation S30 to S50 and the secondary wetting operation S70 to S90 includes a simultaneous supply operation S30 and S70, a first wetting operation S40 and S80, and a second wetting operation S50 and S90. The simultaneous supply operation S30 and S70, the first wetting operation S40 and S80, and the second wetting operation S50 and S90 are sequentially performed. In the simultaneous supply operation S30 and S70, the wetting liquid is supplied from the first fixed nozzle 432 while the first treatment liquid or the second treatment liquid is supplied. In the first wetting operation S40 and S80, the supply of the first treatment liquid or the second treatment liquid is stopped and the supply of the wetting liquid by the first fixing nozzle 432 is maintained. In the second wetting operation S50 and S90, the wetting liquid is supplied from the second fixed nozzle 442 while the supply of the wetting liquid by the first fixed nozzle 432 is maintained.

Figure 4:
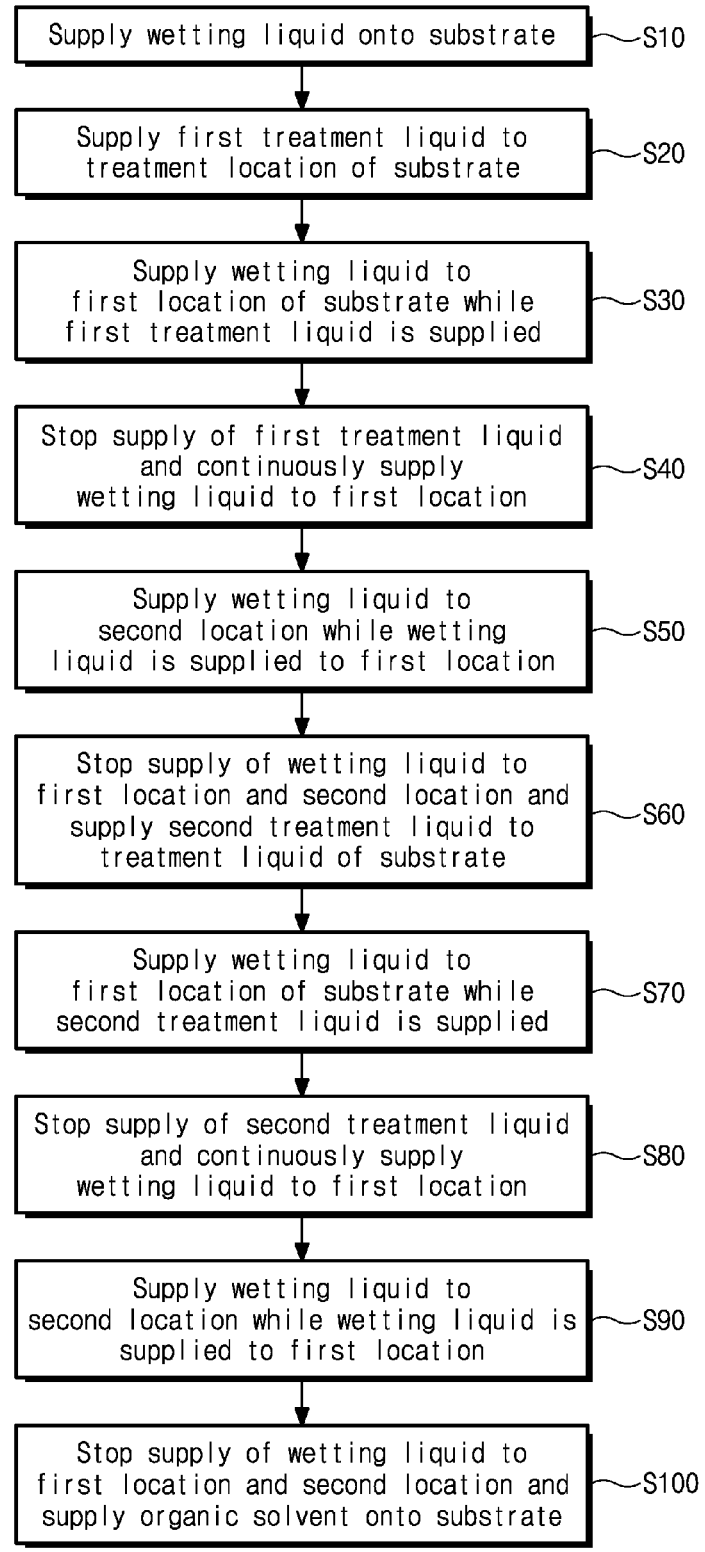
FIG. 4 is a flowchart illustrating a process of treating a substrate.

Next, a method for treating a substrate W by using the aforementioned substrate treating apparatus will be described. A method for hydrophobizing a surface of a substrate W and cleaning the substrate W will be described as an example of the substrate treating method according to the embodiment. FIG. 4 is a flowchart illustrating a process of treating a substrate. FIGS. 5 to 9 are sectional views illustrating a process of treating a substrate by using the liquid supply unit of FIG. 3. In the substrate treating process, a pre-wetting operation S10, a first treatment liquid supplying operation S20, a simultaneous supply operation S30, a first wetting operation S40, a second wetting operation S50, a second treatment supplying operation S60, a simultaneous supply operation S70, a first wetting operation, a second wetting operation S50, and a substitution operation S100 are sequentially performed.

If the pre-wetting operation S10 is performed, the substrate W is rotated and the second fixed nozzle supplies a wetting liquid to the substrate W. The wetting liquid supplied to the second location of the substrate W is diffused to the whole area of the substrate W and converts the surface of the substrate W into a wet state. If the pre-wetting operation S10 is completed, the supply of the wetting liquid is stopped and the first treatment liquid supplying operation S20 is performed.

Figure 5:
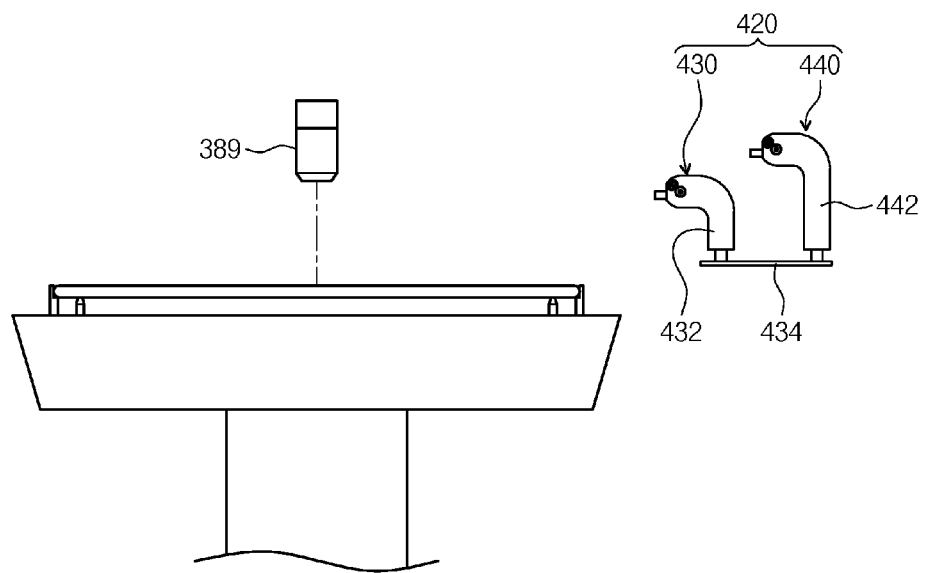
FIGS. 5 to 9 are sectional views illustrating a process of treating a substrate by using the liquid supply unit of FIG. 2.

As illustrated in FIG. 5, in the first treatment supplying operation S20, the first treatment liquid is supplied onto the substrate W. The first movable nozzle 389 is moved to the process location. The first movable nozzle 389 supplies the first treatment liquid to the treatment location of the substrate W. The surface of the substrate W may be hydrophobized by the first treatment liquid. If the first treatment liquid supplying operation S20 is completed, the simultaneous supply operation S30 is performed while the supply of the first treatment liquid is maintained.

Figure 6:
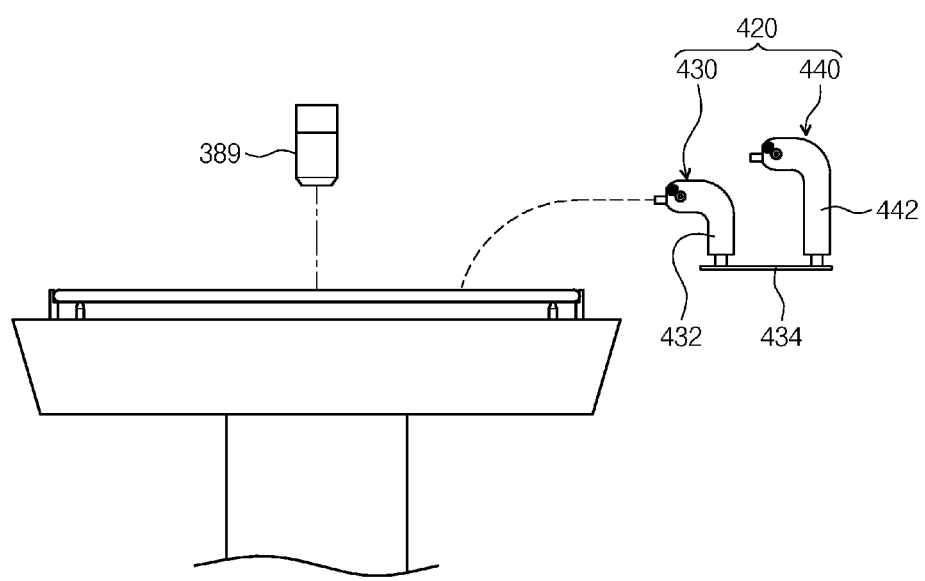

As illustrated in FIG. 6, in the simultaneous supply operation S30, the first treatment liquid and the wetting liquid are simultaneously supplied. The first treatment liquid is supplied to the treatment location of the substrate W, and the wetting liquid is supplied from the first fixed nozzle 432 to the first location of the substrate W. If the simultaneous supply operation S30 is completed, the supply of the first treatment liquid is stopped and the first movable nozzle 389 is moved to the standby location. The first wetting operation S40 is performed while the supply of the wetting liquid is maintained.

Figure 7:
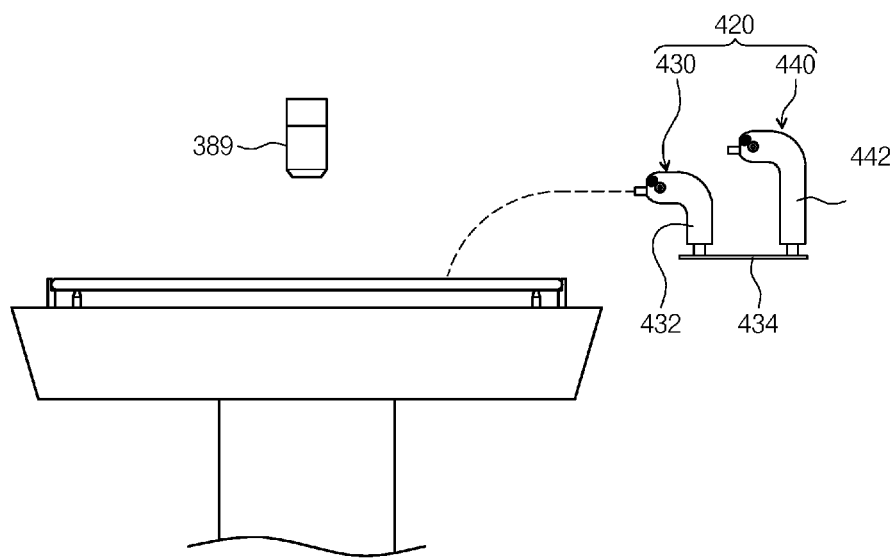

As illustrated in FIG. 7, in the first wetting operation S40, the wetting liquid is supplied onto the substrate W. The first fixed nozzle continuously supplies the wetting liquid in the simultaneous supply operation S30 and the first wetting operation S40. Then, the second fixed nozzle 442 does not supply the wetting liquid. If the first wetting operation S40 is completed, the second wetting operation S50 is performed.

Figure 8:
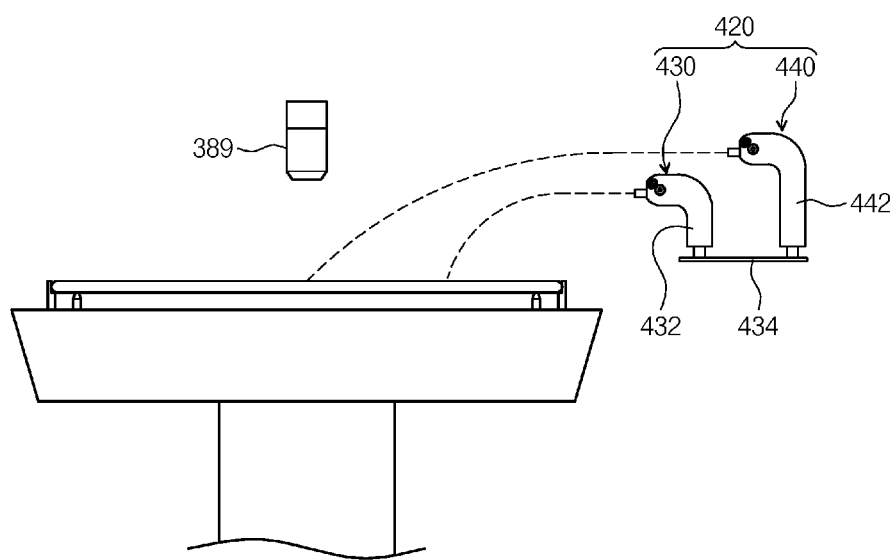

As illustrated in FIG. 8, in the second wetting operation S50, the first fixed nozzle 432 and the second fixed nozzle 442 supply the wetting liquid. Accordingly, the wetting liquid is supplied to the first location and the second location of the substrate W. That is, the first fixed nozzle 432 continuously supplies the wetting liquid in the simultaneously supply operation, the first wetting operation, and the second wetting operation, whereas the second fixed nozzle 442 supplies the wetting liquid in the second wetting operation. If the second wetting operation S50 is completed, the second treatment liquid supplying operation S60 is performed.

Figure 9:
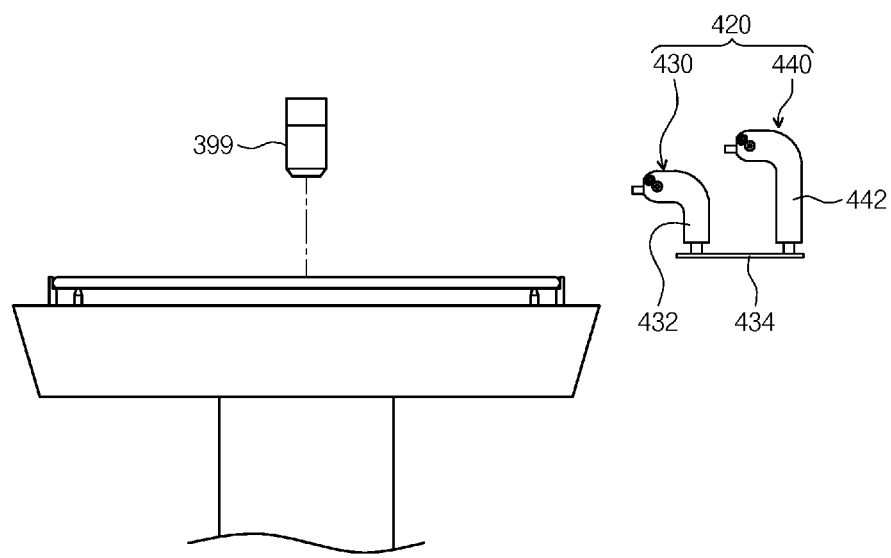

As illustrated in FIG. 9, in the second treatment supplying operation S60, the second treatment liquid is supplied onto the substrate W. The second movable nozzle 399 is moved to the process location. The second movable nozzle 399 supplies the second treatment liquid to the treatment location of the substrate W. The surface of the substrate W may be hydrophilized by the second treatment liquid. If the second treatment liquid supplying operation S60 is completed, the simultaneous supply operation S70 is performed while the supply of the second treatment liquid is maintained.

The following simultaneous supply operation S70, first wetting operation S80, and second wetting operation S90 are the same as the previously performed operations S30 to S50. Accordingly, a repeated description thereof will be omitted.

If the second wetting operation S90 is completed, the substitution operation S100 is performed. In the substitution operation S100, the substitution nozzle 409 is moved to the process location to supply an organic solvent. The wetting liquid residing on the substrate W is substituted by the organic solvent. Thereafter, a surface of the substrate W substituted by the organic solvent is dried through heat treatment or by a gas.

According to the above-mentioned embodiment, the wetting liquid is supplied to the first location before the supply of the treatment liquid is stopped. Further, because the wetting liquid is supplied to a location deviating from the treatment location, the treatment liquid and the wetting liquid may be prevented from spattering.

Figure 10:
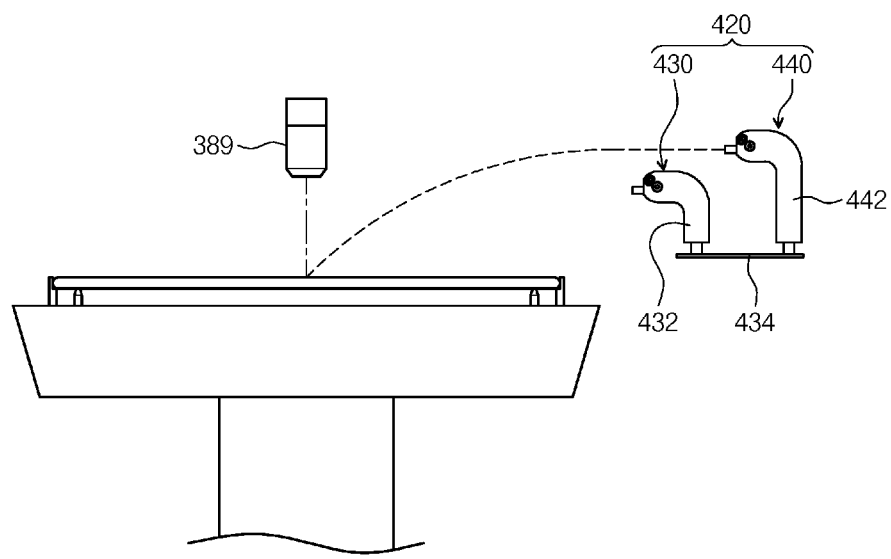
FIG. 10 is a sectional view illustrating another embodiment of the simultaneous supply operation of FIG. 6.

It has been described in the above-described embodiment that the wetting liquid is supplied to the first location of the substrate W in the simultaneous supply operation S30 and S70. However, as illustrated in FIG. 10, the wetting liquid may be supplied to the second location. In this case, the second fixed nozzle 442 may supply the wetting liquid to the second location in the simultaneous supply operation S30 and S70 and the first fixed nozzle 432 and the second fixed nozzle 442 may supply the wetting liquid in the second wetting operation.

According to the embodiment of the inventive concept, the wetting liquid is simultaneously supplied while the treatment liquid is supplied onto the substrate. Accordingly, the surface of the substrate may be prevented from being dried while the treatment liquid is converted to a wetting liquid.

Further, according to the embodiment of the inventive concept, the wetting liquid is supplied to a location that is close to a side end of the substrate than to the center of the substrate. Accordingly, the peripheral area of the substrate may be prevented from being dried.

Further, according to the embodiment of the inventive concept, the wetting liquid is supplied to a location deviating from a treatment location. Accordingly, the wetting liquid may be prevented from spattering.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A method for liquid-treating a substrate, comprising:
   a first treatment liquid supplying operation of supplying a first treatment liquid to a treatment location of the substrate, wherein the first treatment liquid includes hydrofluoric acid; and
   a wetting operation of, after the first treatment liquid supplying operation, supplying a wetting liquid onto the substrate, wherein the wetting liquid is water,
   wherein the wetting operation includes:
   a simultaneous supply operation of supplying the wetting liquid to a first location while the first treatment liquid is supplied, and
   wherein the first location is a location spaced apart from the treatment location.

2. The method of claim 1, wherein the treatment location corresponds to a central area of the substrate, and
   wherein the first location corresponds to a peripheral area of the substrate.

3. The method of claim 2, wherein the wetting operation includes:
   a first wetting operation of, after the simultaneous supply operation, supplying the wetting liquid to the first location of the substrate, and
   wherein the supply of the first treatment liquid is stopped in the first wetting operation.

4. The method of claim 3, wherein the wetting operation further includes:
   a second wetting operation of, after the first wetting operation, supplying the wetting liquid to the first location and a second location, and
   wherein the second location corresponds to a central area of the substrate.

5. The method of claim 4, further comprising:
   a second treatment liquid supplying operation of, after the second wetting operation, supplying a second treatment liquid, which is different from the first treatment liquid, onto the substrate.

6. A method for liquid-treating a substrate, comprising:
   performing a pre-wetting operation including supplying a wetting liquid onto the substrate, wherein the wetting liquid is water;

performing a first treatment liquid supplying operation of, after the pre-wetting operation, supplying a first treatment liquid to a treatment location of the substrate, wherein the first treatment liquid includes hydrofluoric acid; and performing a wetting operation of, after the first treatment liquid supplying operation, supplying the wetting liquid onto the substrate, wherein the wetting operation includes:

a simultaneous supply operation of supplying the wetting liquid to a first location while the first treatment liquid is supplied, and wherein the first location is a location spaced apart from the treatment location.

7. The method of claim 6, wherein the treatment location corresponds to a central area of the substrate, and wherein the first location corresponds to a peripheral area of the substrate.

8. The method of claim 7, wherein the wetting operation includes:

a first wetting operation of, after the simultaneous supply operation, supplying the wetting liquid to the first location of the substrate, and wherein the supply of the first treatment liquid is stopped in the first wetting operation.

9. The method of claim 8, wherein the wetting operation further includes:

a second wetting operation of, after the first wetting operation, supplying the wetting liquid to the first location and a second location, and wherein the second location corresponds to a central area of the substrate.

10. The method of claim 9, further comprising:

a second treatment liquid supplying operation of, after the second wetting operation, supplying a second treatment liquid, which is different from the first treatment liquid, onto the substrate.

* * * * *